US008771927B2

(12) United States Patent
Tang et al.

(10) Patent No.: US 8,771,927 B2
(45) Date of Patent: Jul. 8, 2014

(54) ACID-ETCH RESISTANT, PROTECTIVE COATINGS

(75) Inventors: Tingji Tang, Rolla, MO (US); Gu Xu, Rolla, MO (US); Xing-Fu Zhong, Rolla, MO (US); Wenbin Hong, Rolla, MO (US); Tony D. Flaim, St. James, MO (US); Kimberly Yess, St. James, MO (US); Ramachandran K. Trichur, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 682 days.

(21) Appl. No.: 12/718,516

(22) Filed: Mar. 5, 2010

(65) Prior Publication Data

US 2011/0171478 A1 Jul. 14, 2011

Related U.S. Application Data

(60) Provisional application No. 61/169,604, filed on Apr. 15, 2009.

(51) Int. Cl.
G03F 7/26 (2006.01)

(52) U.S. Cl.
USPC .......................................... 430/313

(58) Field of Classification Search
CPC ................ G03F 7/033; H01L 21/0274; H01L 21/30604; B81C 1/00801; B81C 2201/053; C08G 61/08; C08G 2261/3324; C08G 2261/418
USPC .......................................... 430/311, 313, 323
See application file for complete search history.

(56) References Cited

U.S. PATENT DOCUMENTS

| | | | |
|---|---|---|---|
| 3,868,433 A | 2/1975 | Bartz et al. | |
| 3,959,062 A | 5/1976 | Hoh et al. | |
| 3,970,494 A | 7/1976 | Pritchard | |
| 3,987,122 A | 10/1976 | Bartz et al. | |
| 4,106,943 A | 8/1978 | Ikeda et al. | |
| 4,474,942 A | 10/1984 | Sano et al. | |
| 4,558,114 A | 12/1985 | Goel | |
| 4,710,542 A | 12/1987 | Forgione et al. | |
| 4,793,337 A | 12/1988 | Freeman et al. | |
| 5,043,250 A | 8/1991 | West et al. | |
| 5,087,677 A | 2/1992 | Brekner et al. | |
| 5,191,026 A | 3/1993 | Nishi et al. | |
| 5,602,219 A | 2/1997 | Aulbach et al. | |
| 5,698,645 A | 12/1997 | Weller et al. | |
| 5,773,561 A | 6/1998 | Sachdev et al. | |
| 5,888,650 A | 3/1999 | Calhoun et al. | |
| 6,008,298 A | 12/1999 | Hatke et al. | |
| 6,045,967 A | 4/2000 | Jung et al. | |
| 6,054,363 A | 4/2000 | Sakaguchi | |
| 6,110,999 A | 8/2000 | Ourth et al. | |
| 6,121,340 A * | 9/2000 | Shick et al. ............ 522/31 |
| 6,156,820 A | 12/2000 | Choi | |
| 6,235,818 B1 | 5/2001 | Morizono et al. | |
| 6,440,259 B1 | 8/2002 | Patel | |
| 6,475,629 B1 | 11/2002 | Takeuchi et al. | |
| 6,514,660 B1 * | 2/2003 | Majumdar et al. ............ 430/201 |
| 6,548,579 B2 | 4/2003 | Reski et al. | |
| 6,590,047 B1 | 7/2003 | Chan et al. | |
| 6,639,021 B2 | 10/2003 | Oshima et al. | |
| 6,790,587 B1 | 9/2004 | Feiring et al. | |
| 6,828,020 B2 | 12/2004 | Fisher et al. | |
| 6,858,667 B1 | 2/2005 | Flerlage et al. | |
| 6,869,894 B2 | 3/2005 | Moore | |
| 6,916,681 B2 | 7/2005 | Asano et al. | |
| 6,933,342 B2 | 8/2005 | Parg et al. | |
| 7,084,201 B2 | 8/2006 | Garfield et al. | |
| 7,098,152 B2 | 8/2006 | Moore | |
| 7,208,334 B2 | 4/2007 | Asakawa et al. | |
| 7,288,316 B2 | 10/2007 | Jester | |
| 7,316,844 B2 | 1/2008 | Li et al. | |
| 7,445,881 B2 | 11/2008 | Asakawa et al. | |
| 7,678,861 B2 | 3/2010 | Moore et al. | |
| 2002/0115263 A1 | 8/2002 | Worth et al. | |
| 2002/0127821 A1 | 9/2002 | Ohya et al. | |
| 2003/0087180 A1 * | 5/2003 | Kudo et al. ............ 430/270.1 |
| 2003/0149207 A1 | 8/2003 | Walter et al. | |
| 2003/0168158 A1 | 9/2003 | Kato | |
| 2004/0106062 A1 * | 6/2004 | Petrov et al. ............ 430/270.1 |

(Continued)

FOREIGN PATENT DOCUMENTS

CA 1 268 409 5/1990
EP 0133357 2/1985

(Continued)

OTHER PUBLICATIONS

Chamran et al., "3-Dimensional Electrodes for Microbatteries," Proceedings of IMECE04, ASME International Mechanical Engineering Congress and Exposition, Anaheim, CA, Nov. 13-20, 2004, paper IMECE2004-61925.

Charlton et al., "Fabrication of High Aspect Ratio Silicon Microstructure by Anodic Etching," Journal of Micromechanics and Microengineering, vol. 7, No. 3, 1997, 155-158.

International Search Report and Written Opinion dated Jan. 14, 2011, in corresponding application PCT/US2010/027937 filed on Mar. 19, 2010.

(Continued)

*Primary Examiner* — Brittany Raymond
(74) *Attorney, Agent, or Firm* — Hovey Williams LLP

(57) ABSTRACT

New compositions and methods of using those compositions as protective layers during the production of semiconductor and MEMS devices are provided. The compositions comprise a cycloolefin copolymer dispersed or dissolved in a solvent system, and can be used to form layers that protect a substrate during acid etching and other processing and handling. The protective layer can be photosensitive or non-photosensitive, and can be used with or without a primer layer beneath the protective layer. Preferred primer layers comprise a basic polymer in a solvent system.

16 Claims, No Drawings

(56) References Cited

U.S. PATENT DOCUMENTS

| | | | |
|---|---|---|---|
| 2004/0185187 | A1 | 9/2004 | Yokoyama et al. |
| 2004/0213994 | A1 | 10/2004 | Kozakai et al. |
| 2004/0260021 | A1 | 12/2004 | Macedo et al. |
| 2004/0266947 | A1 | 12/2004 | Macedo et al. |
| 2005/0026071 | A1 | 2/2005 | Lee |
| 2005/0084795 | A1 | 4/2005 | Jung |
| 2005/0164509 | A1 | 7/2005 | Koshimizu et al. |
| 2005/0173064 | A1 | 8/2005 | Miyanari |
| 2005/0181579 | A1 | 8/2005 | Thallner |
| 2005/0191779 | A1 | 9/2005 | Le Vaillant et al. |
| 2006/0003165 | A1 | 1/2006 | Akatsuka et al. |
| 2006/0100403 | A1 | 5/2006 | Yoon et al. |
| 2006/0141241 | A1 | 6/2006 | Carespodi et al. |
| 2006/0183269 | A1 | 8/2006 | Fuergut et al. |
| 2006/0234164 | A1 | 10/2006 | Rhodes et al. |
| 2007/0134459 | A1 | 6/2007 | Hubert et al. |
| 2007/0172669 | A1 | 7/2007 | Amon et al. |
| 2007/0185310 | A1 | 8/2007 | Moore et al. |
| 2007/0232026 | A1 | 10/2007 | Apanius et al. |
| 2008/0073741 | A1 | 3/2008 | Apanius et al. |
| 2008/0075901 | A1 | 3/2008 | Lee et al. |
| 2008/0085979 | A1 | 4/2008 | Ohkita et al. |
| 2008/0152837 | A1 | 6/2008 | Chien et al. |
| 2008/0173970 | A1 | 7/2008 | Pillalamarri |
| 2008/0200011 | A1 | 8/2008 | Pillalamarri et al. |
| 2009/0038750 | A1 | 2/2009 | Hong et al. |
| 2010/0112305 | A1 | 5/2010 | Hong et al. |

FOREIGN PATENT DOCUMENTS

| | | |
|---|---|---|
| EP | 1 700 896 | 9/2006 |
| WO | 9106587 | 5/1991 |
| WO | 97/33198 | 9/1997 |
| WO | 2006093639 | 9/2006 |
| WO | 2007032537 | 3/2007 |
| WO | 2008045669 | 4/2008 |

OTHER PUBLICATIONS

Office Action dated Feb. 1, 2011 in related U.S. Appl. No. 12/969,367, filed Dec. 15, 2010.
TOPAS: Cyclic Olefin Copolymer (COC), TOPAS Advanced Polymers Booklet, Published in Mar. 2006, 20 pages.
Schut, "New Cyclic Olefins Are Clearly Worth a Look," Mar. 2000, Plastics Technology, 4 pages.
Jouve et al., "Material improvement for ultrathin-wafer handling in TSV creation and PECVD process," 2009, IEEE, pp. 1-5.
Bai et al., "Temporary Wafer Bonding Materials with Adjustable Debonding Properties for Use in High-Temperature Processing," 2008, IMAPS, pp. 000222-000227.
Office Action dated Sep. 6, 2011 in related U.S. Appl. No. 12/969,367, filed Dec. 15, 2010.
Office Action dated May 5, 2011 in related U.S. Appl. No. 12/263,120, filed Oct. 31, 2008.
International Preliminary Report on Patentability dated Oct. 27, 2011, in corresponding application PCT/US2010/027937 filed on Mar. 19, 2010.
d-limonene. A data sheet from the Compendium of Pesticide Common Names, 1 page.
Safety (MSDS) data for Triton X-100, 1 page.
ExxonMobil Chemical Vistalon, Vistalon 2504 Specifications, 2005, 1 page.
Material Safety Data Sheet, ExxonMobil Chemical Company, Vistalon Ethylene Propylene Rubber, Apr. 14, 2005, 1 page.
IDES, The Plastics Web, Zeonex 480R, 1 page, 2006, http://www.ides.com/grades/ds/E40300.htm.
Eastman Product Data Sheet, Eastotack H-142W Resin, Sep. 13, 2006, 2 pages, http://www.eastman.com/ProductCatalogApps/PageControllers/ProdDatasheet_PC.aspx?p . . . .
Eastman H-142 Resin, Application Uses and Key Attributes, Sep. 13, 2006, 1 page http://www.eastman.com/products/producthome.asp-?product=71016204&SelectorUrl=%2 . . . .
www.sigma-aldrich.com, 457531 Poly-a-pinene, Sep. 13, 2006, http://www.sigmaaldrich.com/catalog/search/ProductDetail/ALDRICH/457531?PrtPrv=1 . . . .
Yi et al., "Synthesis and characterization of poly(amideimide)s containing aliphatic diamine moieties," Die Angewandte Makromolekulare Chemie, 233 (1995), pp. 89-101. (Abstract only).
Puligadda et al., "High-Performance Temporary Adhesives for Wafer Bonding Applications," Mater. Res. Soc. Symp. Proc., vol. 970, 2007.
Pillalamarri et al., "High-Temperature Spin-on Adhesives for Temporary Wafer Bonding," IMAPS 2006: Proceedings of the International Microelectronics and Packaging Society 39th International Symposium on Microelectronics, Oct. 8-12, 2006, pp. 105-111.
Rivas et al., "Thermal Degradation of Copolymers Based on 2-Substituted Oxazoline and β-Methylhydrogenitaconate," Polymer Bulletin, vol. 33, pp. 97-101(1994).
Boustedt et al., "Flip Chip as an Enabler for MEMS Packaging," 2002, 2002 IEEE Electronics Components and Technology Conference, pp. 124-128.
Watanabe et al., "Three-Component Negative-Type Photosensitive Polyimide Precursor Based o Poly(amic acid), a Crosslinker, and a Photoacid Generator," Journal of Polymer Science: Part A, vol. 43, pp. 593-599 (2004).
Frump, "Oxazolines. Their preparation, reactions, and applications," Chem. Rev., 71 (5), 483-505, 1971.
Shin et al., "Chemical Structure and Physical Properties of Cyclic Olefin Copolymers," Pure Appl. Chem., vol. 77, No. 5, pp. 801-814, 2005.
Topas Advanced Polymers Company Information, information posted 2006 at www.topas.com, 10 pages.
Office Action dated Dec. 9, 2010 in related U.S. Appl. No. 12/263,120, filed Oct. 31, 2008.
Smith et al., "A Chemical and Thermal Resistant Wafer Bonding Adhesive Simplifying Wafer Backside Processing," CS MANTECH Conference, Apr. 2006, Vancouver, British Columbia, Canada, 269-271.
Buna EP T 6250, Lanxess, Lanxess Deutschland GmbH, Business Unit Technical Rubber Products, Product Data Sheet.
Eastman, Eastotac, http://www.eastman.com/brands/eastotac/producthome.asp?product=71016204.
Eastman, Product Data Sheet, Eastotac Resin H-142W, http://eastman.com/productcatalogapps/pagecontrollers/proddatasheet_PC.aspx?.
Niklaus et al., "Adhesive Wafer Bonding," J. Appl. Phys., 2006, 99, 031101.
Moore et al., "High Temperature Resistant Adhesive for Wafer Thinning and Backside Processing," MANTECH 2004, 8.10, 4 pages.
Brubaker et al., "Advances in Processing of Compound Semiconductor Substrates," MANTECH 2005, 4 pages.
Combe et al., "Reversible Wafer Bonding: Challenges in Ramping up 150mm GaAs Wafer Production to Meet Growing Demand," MANTECH 2006, 4 pages.
Kwon et al., "An Evaluation Process of Polymeric Adhesive Wafer Bonding for Vertical System Integration," Japanese Journal of Applied Physics, vol. 44, No. 6A, 2005, pp. 3893-3902.
Technical DataSheet Abstract Ebecryl 168, UCB Chemicals, Additive, Adhesion promoter/Bonding agent, 2006 SpecialChem S.A., 1 page http://www.specialchem4coatings.com/common/pc/product/displayproduct.aspx?id=12887&srchid=220571.
MatWeb, The Online Materials Database: Zeon Chemicals Zeonex 480R Cyclo Olefin Optical Grade Polymer; Subcategory: Cyclo Olefin Polymer, Polymer, Thermoplastic, 2006, 1 page http://www.matweb.com/search/SpecificMaterialPrint.asp?bassnum=PZEON6.
Niklaus, Adhesive Wafer Bonding Technology, Department of Signals, Sensors and Systems, Royal Institute of Technology (KTH), Stockholm, Sweden, Copyright 2002, 33 pages.
Grunsven et al., "Wafer Level Chip Size Packaging Technology for Power Devices Using Low Ohmic Through-Hole Vias," 14th European Microelectronics and Packaging Conference and Exhibition, Germany, Jun. 23-25, 2003, pp. 46-50.
Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.

(56) References Cited

OTHER PUBLICATIONS

Library 4 Science, Pinene, 2006, 1 page, http://www.chromatography-online org/topics/pinene.html.
Technical DataSheet Abstract Vanax 808 HP, R.T. Vanderbilt, Additive, Crosslinking Catalyst/Accelerator/Initiator >>Amine or Nitrogen Content, 2006 SpecialChem S.A., 2006, 1 page http://www.specialchem4polymers.com/common/pa/product/displayproduct.aspx?id=7815&srchid=292522.
Ciba Specialty Chemicals, Additives, Polymer Additives, Ciba IRGANOX 1010, Phenolic Primary Antioxidant for Processing and Long-Term Thermal Stabilization, Oct. 1999, 2 pages.
Ciba Specialty Chemicals, Additives, Polymer Additives, Ciba IRGAFOS 168, Hydrolytically Stable Phosphite Processing Stabilizer, Sep. 1999, 2 pages.
Chemical Land 21, Organic Chemicals, Mesitylene, 1 page.
International Search Report and Written Opinion dated May 12, 2010, in related PCT/US2009/061633 filed on Oct. 22, 2009.

* cited by examiner

ACID-ETCH RESISTANT, PROTECTIVE COATINGS

FEDERALLY SPONSORED RESEARCH

This invention was made with government support under contract number N66001-08-C-2081 awarded by the Defense Advanced Research Projects Agency of the U.S. Department of Defense. The United States Government has certain rights in the invention.

RELATED APPLICATIONS

This application claims the priority benefit of a provisional application entitled SPIN-ON, NON-PHOTOSENSITIVE AND PHOTOSENSITIVE, ACID-ETCH RESISTANT, COATING COMPOSITIONS FORMED FROM CYCLIC OLEFIN COPOLYMERS, Ser. No. 61/169,604, filed Apr. 15, 2009, incorporated by reference herein.

BACKGROUND OF THE INVENTION

1. Field of the Invention

The present invention is broadly concerned with novel compositions and methods of using those compositions to form protective layers that can protect an underlying wafer during acid etching and other harsh processing conditions. Such protection is useful in the manufacture of microelectronic devices such as those used in microelectromechanical systems (MEMS)

2. Description of the Prior Art

Deep silicon etching is an essential manufacturing step for all microelectromechanical systems (MEMS). Wet chemical etching in alkaline solutions has dimensional limits due to the differential etch rate of the crystal planes of silicon. Deep reactive etching (DRIE) processes have the ability to etch smaller features with high aspect ratios and can be used for new applications, such as the formation of through-silicon vias (TSVs) for three-dimensional (3-D) integrated circuit fabrication. This technique, however, requires expensive tooling and relatively long process times to complete the manufacturing cycle and still is deficient in meeting dimensional tolerances. New materials and processes are therefore needed to create very-high-aspect-ratio (VHAR), 3-D device features in silicon in a cost-efficient manner and with greater and more precise depth-to-width capabilities than current state-of-art technologies.

Photoelectrochemical (PEC) silicon etching utilize hydrofluoric acid (HF) as the active species to yield a highly controllable and high aspect ratio of greater than 120:1 for standing beams and trench structures within the silicon substrates. PEC deep silicon etching uses a low concentration (2-5%) of HF in water as the etching media, while oxide etching processes usually rely on concentrated aqueous HF (49%) or HF vapor (100%) to achieve suitable etching rates. In either case, masking layers are required to allow selective etching of different regions of the silicon device and/or to protect sensitive areas of the device from the corrosive effects of the etchant. Deposited layers such as silicon nitride, polysilicon, or even a metal mask have been traditionally used for this purpose. However, the need to deposit these layers using chemical vapor deposition (CVD), patterning them, and removing them creates great process flow complexity, which is very expensive and leads to high unit costs.

MEMS devices are increasing in complexity and are finding numerous applications in industrial and consumer products such as cellular phones, micromirrors, radio frequency (RF) devices, microprobes, and pressure sensors. One of the critical processing steps for these devices is release etching. In this step, a sacrificial layer, usually silicon oxide, is removed from certain regions to allow a range or motion of specific features. The thickness of the materials to be removed may vary from a few hundred angstroms to several microns. Because this sacrificial layer is silicon oxide in most cases. MEMS release etching has been historically performed using wet fluorinated chemistries that tend to produce strong surface tension and lead to stiction, resulting in either device malfunction or a reduction in the final product yield.

Recently, it has been demonstrated that using HF vapor for release etching can efficiently circumvent the stiction phenomenon because it substantially eliminates the surface tension that causes the stiction. During HF vapor etching, it is necessary to use masking or protective materials to protect the silicon oxide and metal features from HF attack. Traditionally, inorganic-based films such as silicon nitride ($Si_3N_4$), alumina ($Al_2O_3$), SiC, polysilicon, and aluminum were used to provide protection during HF vapor etching, but the effectiveness of their protection against HF attack was very limited due to the nature of the materials. Moreover, such inorganic masking layers require high-temperature deposition techniques, which are often lengthy and complicated. Films have been reported that can survive HF vapor etching processes for only 80 seconds or less, but this limits its practical applications. Some films deposited by chemical vapor deposition (CVD) can supposedly survive HF vapor etching for longer than 80 seconds, but CVD is an expensive and involved process.

Therefore, the demands placed on newly developed polymeric protective materials are very high. To date, however, there has been little success in using conventional photoresists or other common organic layers for HF etching because the very small HF molecules (~0.92 Å in diameter) diffuse through, or in most cases decompose, these protective materials, thus leading to substrate corrosion, etching in protected areas, undercutting, and/or lifting of the masking layer from the edge.

There is a need for new polymeric protective coatings that are resistant to acid etching.

SUMMARY OF THE INVENTION

The present invention provides a method of forming a microelectronic structure. The method comprises providing a substrate having a surface and optionally forming a primer layer on the substrate surface. A protective formed on primer layer, if present or on the substrate surface if no primer layer is present, to yield a protected stack. The protective layer is formed from a composition comprising a cycloolefin copolymer dissolved or dispersed in a solvent system. The protected stack is subjected to an acidic etching process.

The invention is also directed towards an article comprising: a substrate having a surface optionally a primer layer on the substrate surface; and a protective layer on the primer layer, if present, or on the substrate surface if no primer layer is present. The protective layer is formed from a composition comprising a cycloolefin copolymer dissolved or dispersed in a solvent system. The protective layer has first and second sides, with the first side being adjacent the primer layer, if present, or adjacent the substrate surface if no primer layer is present. Furthermore, there is no wafer in contact with the second side of the protective layer.

Finally, the invention also provides a composition useful for forming a protective layer on a substrate, where the composition comprises a cycloolefin copolymer and a photosensitive crosslinking agent dissolved or dispersed in a solvent system.

DETAILED DESCRIPTION OF THE PREFERRED EMBODIMENTS

Protective Layer

In more detail, the compositions used to form the inventive protective layers comprise a highly non-polar, hydrophobic, hydrocarbon polymer dispersed or dissolved in a solvent system. The preferred such polymer is a cycloolefin copolymer (COC). Advantageously, the inventive composition is provided in both a non-photosensitive and a photosensitive form, with the latter including a photosensitive crosslinking agent, as discussed in more detail below.

The COC is present in the composition at levels of from about 70% to about 100% by weight, preferably from about 80% to about 95%, and more preferably from about 90% to about 95% by weight, based upon the total weight of solids taken as 100% by weight.

The preferred copolymers are thermoplastic and preferably a high-molecular weight COC. As used herein, "high-molecular weight COC" refers to COCs having a weight average molecular weight ($M_w$) of from about 50,000 Daltons to about 200,000 Daltons, more preferably from about 70,000 Daltons to about 150,000 Daltons, and even more preferably from about 85,000 to about 100,000. Suitable copolymers also preferably have a glass transition temperature ($T_g$) of at least about 60° C., more preferably from about 60° C. to about 200° C., and most preferably from about 75° C. to about 160° C.

Preferred cycloolefin copolymers are comprised of recurring monomers of cyclic olefins and acyclic olefins, or ring-opening polymers based on cyclic olefins. Suitable cyclic olefins for use in the present invention are selected from the group consisting of norbornene-based olefins, tetracyclododecene-based olefins, dicyclopentadiene-based olefins, and derivatives thereof. Derivatives include alkyl (preferably $C_1$-$C_{20}$ alkyls, more preferably $C_1$-$C_{10}$ alkyls), alkylidene (preferably $C_1$-$C_{20}$ alkylidenes, more preferably $C_1$-$C_{10}$ alkylidenes), aralkyl (preferably $C_6$-$C_{30}$ aralkyls, more preferably $C_6$-$C_{18}$ aralkyls), cycloalkyl (preferably $C_3$-$C_{30}$ cycloalkyls, more preferably $C_3$-$C_{18}$ cycloalkyls), ether, acetyl, aromatic, ester, hydroxy, alkoxy, cyano, amide, imide, and silyl-substituted derivatives. Particularly preferred cyclic olefins for use in the present invention include those selected from the group consisting of

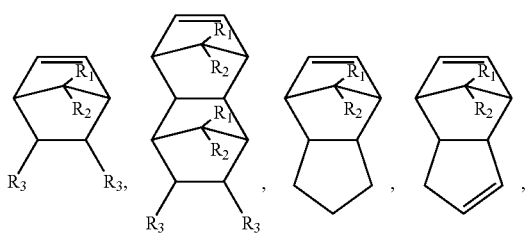

-continued

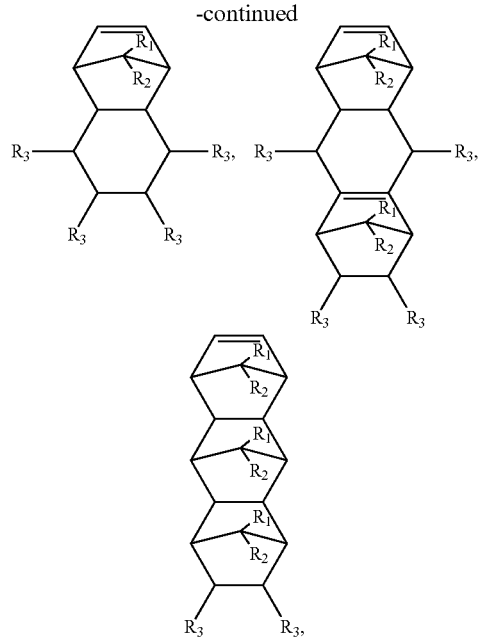

aryl combinations of the foregoing, where each $R_1$ and $R_2$, individually selected from the group consisting of —H, and alkyl groups (preferably $C_1$-$C_{20}$ alkyls, more preferably $C_1$-$C_{10}$ alkyls), and each $R_3$ is individually selected from the group consisting of —H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups such as benzyl, phenethyl, and phenylpropyl, etc.), ester groups, ether groups, acetyl groups, alcohols (preferably $C_1$-$C_{10}$ alcohols), aldehyde groups, ketones, nitriles, and combinations thereof.

Preferred acyclic olefins are selected from the group consisting of branched and unbranched $C_2$-$C_{20}$ alkenes (preferably $C_2$-$C_{10}$ alkenes). More preferably, suitable acyclic olefins for use in the present invention have the structure

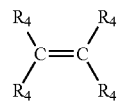

where each $R_4$ is individually selected from the group consisting of —H and alkyl groups (preferably $C_1$-$C_{20}$ alkyls, more preferably $C_1$-$C_{10}$ alkyls). Particularly preferred acyclic olefins for use in the present invention include those selected from the group consisting of ethene, propene, and butene, with ethene being the most preferred.

Methods of producing cycloolefin copolymers are known in the art. For example, cycloolefin copolymers can be produced by chain polymerization of a cyclic monomer with an acyclic monomer (such as norbornene with ethene as shown below).

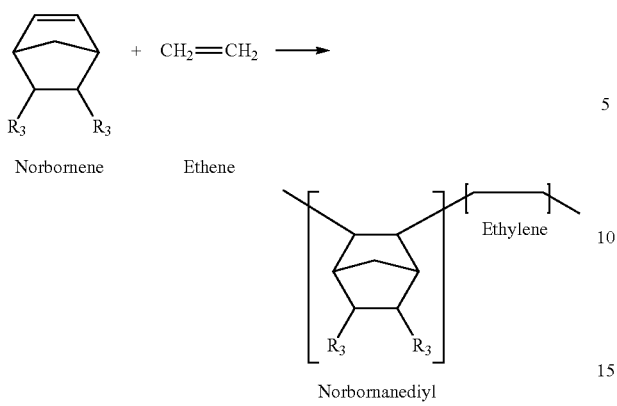

Norbornene  Ethene

Norbornanediyl

The reaction shown above results in an ethene-norbornene copolymer containing alternating norbornanediyl and ethylene units. Examples of copolymers produced by this method include TOPAS®, produced by Goodfellow Corporation and TOPAS Advanced Polymers, and APEL®, produced by Mitsui Chemicals. A suitable method for making these copolymers is disclosed in U.S. Pat. No. 6,008,298, incorporated by reference herein.

Cycloolefin copolymers can also be produced by ring-opening metathesis polymerization of various cyclic monomers followed by hydrogenation as illustrated below.

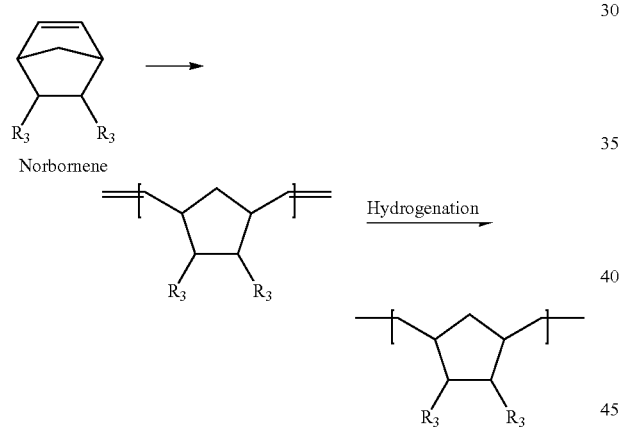

Norbornene

Hydrogenation

The polymers resulting front this type of polymerization can be thought of conceptually as a copolymer of ethene and a cyclic olefin monomer (such as alternating units of ethylene and cyclopentane-1,3-diyl as shown below).

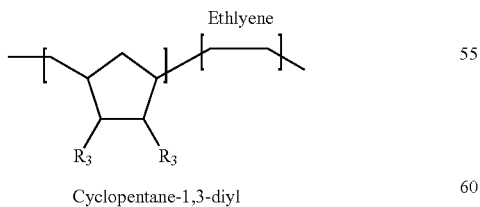

Ethlyene

Cyclopentane-1,3-diyl

Examples of copolymers produced by this method include ZEONOR® from Zeon Chemicals, and ARTON® from JSR Corporation. A suitable method of making these copolymers is disclosed in U.S. Pat. No. 5,191,026, incorporated by reference herein.

Accordingly, copolymers of the present invention preferably comprise recurring monomers of:

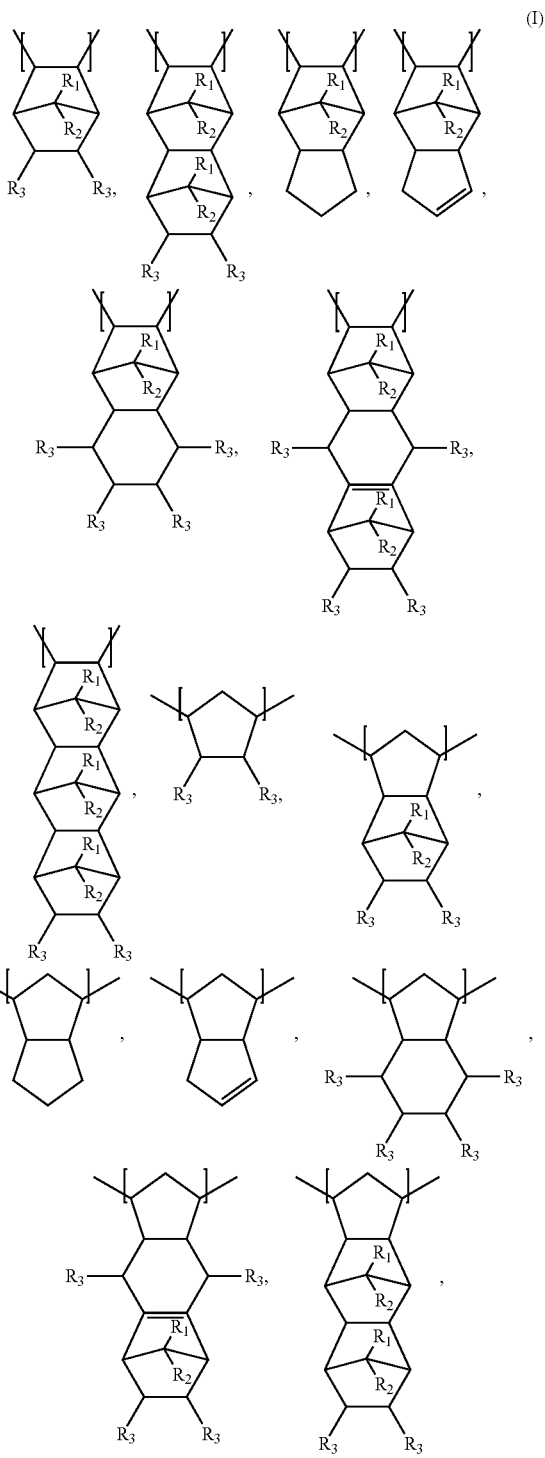

(I)

and combinations of the foregoing, where:

each $R_1$ and $R_2$ is individually selected from the group consisting of —H, and alkyl groups (preferably $C_1$-$C_{20}$ alkyls, more preferably $C_1$-$C_{10}$ alkyls), and each $R_3$ is individually selected from the group consisting of —H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups, such as benzyl, phenethyl, and phenylpropyl, etc.), ester groups, ether groups, acetyl groups, alcohols (preferably $C_1$-$C_{10}$ alcohols), aldehyde groups, ketones, nitriles, and combinations thereof;

and

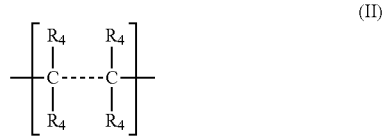

(II)

where:
- - - - - is a single or double-bond; and
each $R_4$ is individually selected from the group consisting of —H and alkyl groups (preferably $C_1$-$C_{20}$ alkyls, more preferably $C_1$-$C_{10}$ alkyls).

The ratio of monomer (I) to monomer (II) within the polymer is preferably from about 5:95 to about 95:5, and more preferably from about 30:70 to about 70:30.

As mentioned above, when a photosensitive version of the composition is desired, a photosensitive crosslinking agent is included in the composition. In this embodiment, the photosensitive crosslinking agent is included at levels of from about 1% to about 15% by weight, preferably from about 2% to about 10% by weight, and more preferably from about 4% to about 6% by weight, based upon the total weight of solids in the composition taken as 100% by weight. It is preferred that the photosensitive crosslinking agent be an azide-based photosensitive crosslinking agent. Suitable examples include those selected from the group consisting of 2,6-bis-(4-azidobenzylidene)-4-methyleyclohexanone, 2,6-bis-(4'-azidobenzal)cyclohexanone, 2,6-bis-(4'-diazidobenzal)-4-methylcyclohexanone, 4,4'-diazidostilbebe, p-phenylenebisazide, 4,4'-diazidobenzophenone, 4,4'-diazidodiphenylmethane, 4,4'-diazidocalcon, 4,4'-diazidodiphenyl, 4,4'-diazido-3,3'-dimethyldiphenyl, and 2,7-diazidofluorene.

The photosensitive embodiment can optionally include a sensitizer, if desired, to increase the photospeed and lithographic performance of the composition. When a sensitizer is included, it is preferably used at levels of from about 0.5% to about 10% by weight, and preferably about 4% to about 6% by weight, based upon the total weight of solids in the composition taken as 100% by weight. Suitable sensitizers include those selected from the group consisting of carbonyl compounds (e.g., benzophenone, anthraquinone, 1,2-naphthoquinone, 1,4-naphthoquinone, 2-methylanthraquinone, benzanthrone, violanthrone, 9-anthraldehyde, benzil); aromatic hydrocarbon compounds (e.g., anthracene, chrysene); nitro compounds (e.g., nitroaniline, 2-chloro-4-nitroaniline, 5-nitro-2-aminotoluene, tetracyanoethylene); and sulfur compounds (e.g., diphenyl disulfide).

With either embodiment, the composition used to form the inventive protective layers can include additional ingredients, including low-molecular weight cycloolefin copolymer (COC), plasticizers/adhesion promoters, and/or antioxidants.

When a low-molecular weight COC is used in the composition, it is preferably present in the composition at a level of from about 1% to about 99% by weight, more preferably from about 10% to about 50% by weight, and even more preferably from about 20% to about 30% by weight, based upon the total weight of solids in the composition taken as 100% by weight. The term "low-molecular weight COC" is intended to refer to COCs having a weight average molecular weight ($M_w$) of less than about 15,000 Daltons, preferably less than about 10,000 Daltons, and more preferably from about 500 to about 8,500 Daltons.

Such low-molecular weight COCs also preferably have a $T_g$ of from about 50° C. to about 120° C., more preferably from about 60° C. to about 90° C., and most preferably from about 60° C. to about 70° C. Exemplary low-molecular weight COC resins for use in the present compositions are those sold under the name TOPAS® Toner ($M_w$ 8,000), available from Topas Advanced Polymers.

When a plasticizer/adhesion promoter is included in the composition, it is preferably present at levels of from about 1% to about 10% by weight, and preferably from about 4% to about 6% by weight, based upon the total weight of solids in the composition taken as 100% by weight. Suitable plasticizers/adhesion promoters include those selected from the group consisting of polyisobutylene (preferably about 1,000-40,000 Daltons, more preferably about 1,000-20,000 Daltons, and more preferably about 1,000-10,000 Daltons), terpene, polyterpene resin (SYLVARES™ TR resin from Arizona Chemical), beta-polyterpene resin (SYLVARES™ TR-B resin from Arizona Chemical), styrenated terpene resin (ZONATAC™ NG resin from Arizona Chemical), polymerized rosin resin (SYLVAROS® PR resin from Arizona Chemical), rosin ester resin (EASTOTAC™ resin from Eastman Chemical), cycloaliphatic hydrocarbon resin (PLASTOLYN™ resin from Eastman Chemical, ARKON resin from Arakawa Chemical), C5 aliphatic hydrocarbon resins (PICCOTAC™ resin from Eastman Chemical), and hydrogenated hydrocarbon resins (REGALITE™ resin from Eastman Chemical).

The inventive compositions are formed by simply mixing the cycloolefin copolymer and any other ingredients with the solvent system, preferably at room temperature to about 150° C., for time periods of from about 60 minutes to about 720 minutes (until the COC and solvent forms a solution). The total solids level in the composition should be from about 5% to about 85% by weight, preferably from about 5% to about 60% by weight, and more preferably from about 10% to about 40% by weight, based upon the total weight of the composition taken as 100% by weight. Thus, the composition should comprise from about 15% to about 95% by weight solvent system, preferably from about 40% to about 95% by weight solvent system, and more preferably from about 60% to about 90% by weight solvent system, based upon the total weight of the composition taken as 100% by weight.

The solvent system should have a boiling point of from about 50 to about 280° C., and preferably from about 120 to about 250° C. Suitable solvents include, but are not limited to, hydrocarbon solvents selected from the group consisting of d-limonene, mesitylene, dipentene, pinene, bicyclohexyl, cyclododecene, 1-tert-butyl-3,5-dimethylbenzene, butylcyclohexane, cyclooctane, cycloheptane, cyclohexane, methylcyclohexane, and mixtures thereof.

Primer Layer

Another suitable primer layer comprises a basic polymer dispersed or dissolved in a solvent system. A basic polymer will be one that will have a pH of at least about 7 when dispersed in an aqueous solution at a concentration of about 1% by weight. The basic polymer will preferably comprise recurring monomers that include nitrogen atoms present as part of amine groups (e.g., pyridines). While the polymer could be a copolymer of such amine-containing monomers and a monomer that does not include amine groups, in such instances the amine-containing monomers should be present at levels of at least about 10%, preferably at least about 50%, and more preferably at least about 70%, of the total monomer units present.

Preferred basic polymers include those selected from the group consisting of polyvinyl pyridine, polymelamines, polyethylenimine, triazine-containing copolymers, styrene maleimide resin, poly(4-vinyl pyridine-co-styrene), and poly(2-vinyl pyridine-co-styrene). The basic polymer is present in the composition at levels of from about 1% to about 20% by weight, preferably from about 5% to about 15%, and more preferably from about 7% to about 15% by weight, based upon the total weight of the composition taken as 100% by weight.

Preferred solvent systems for this primer layer include those selected from the group consisting of cyclopentanone, propylene glycol methyl ether acetate ("PGMEA"), methyl ethyl ketone ("MEK"), and methyl isoamyl ketone ("MIAK"). The solvent system is present in the primer composition at levels of from about 80% to about 99% by weight, preferably from about 85% to about 95%, and more preferably from about 85% to about 93% by weight, based upon the total weight of the composition taken as 100% by weight.

The primer layer compositions are formed by simply mixing the basic polymer with the solvent system, preferably at room temperature to about 150° C., for time periods of from about 60 minutes to about 300 minutes.

Application Process

The protective layer, either with or without the primer layer, can be applied to any number of substrates (wafers or layers) in need of protection. The substrate will commonly be a thermal oxide substrate, but can also include substrates selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

In embodiments where a primer layer is utilized, the primer composition is spin-applied onto the substrate at speeds of from about 500 to about 5,000 rpm, and preferably from about 1,000 to about 3,000 rpm, for about 30-90 seconds, and preferably for about 60 seconds. The composition is then baked at a temperature of from about 80° C. to about 130° C. for a time period of from about 60 seconds to about 150 seconds (preferably about 120 seconds) to form the primer layer. It is preferred that the primer layer has an average thickness (as measured by an ellipsometer over 5 different points) of from about 100 nm to about 3,000 nm, and more preferably from about 400 nm to about 1,000 nm.

To form the protective layer, the protective composition is spin coated onto the substrate (or in the primer layer, if utilized) at about 1,000-5,000 rpm, and preferably from about 1,000-2,000 rpm, for about 30-90 seconds, and preferably about 60 seconds. The composition is then baked at a temperature of from about 110° C. to about 300° C., and more preferably from about 150° C. to about 220° C., for a time period of from about 120 seconds to about 300 seconds (preferably about 180 seconds) to form the protective layer. The average coating thickness after baking (as measured by an ellipsometer over 5 different points) is from about 3,000 nm to about 20,000 nm, and preferably from about 10,000 nm to about 15,000 nm, depending upon the degree of coverage required on the substrate.

In embodiments where the protective layer is photosensitive, the layer can be imaged by exposing it to radiation, such as UV light, with a wavelength of from about 150-500 nm (e.g., about 157 nm, about 248 nm, about 365 nm), preferably in a dose of from about 400 $mJ/cm^2$ to about 2,500 $mJ/cm^2$. The coating is then preferably post-exposure baked at a temperature of from about 110° C. to about 150° C., and preferably from about 140° C. to about 145° C., for a time period of from about 180 seconds to about 300 seconds, and developed with a solvent for a time period of from about 30 seconds to about 120 seconds. Suitable solvents for developing the layer include those selected from the group consisting of d-limonene, mesitylene, dodecene, and isopropyl alcohol ("IPA"). Finally, the coating is baked at about 150° C. to about 200° C. for about 180 seconds to about 300 seconds.

Light exposure causes the photosensitive crosslinker to decompose into a nitrene, which is a very active species. The nitrene leads to a hydrogen abstraction reaction, which results in crosslinking at the active hydrogen in the norbornene monomer unit in the COC polymer chains. The photosensitive embodiment of this invention negative working. Thus, the UV-exposed areas are crosslinked and become insoluble in developers, while the unexposed areas remain soluble and can be washed away by developing to form a pattern in the protective layer. More specifically, the exposed areas become substantially insoluble (e.g., less than about 1% by weight soluble, preferably less than about 0.05% soluble, and more preferably about 0% soluble) in typical solvents/developers such as d-limonene, mesitylene, and IPA.

After the photosensitive protective layer has been developed, the primer layer, if present, can also be developed by an organic solvent such as isopropyl alcohol, cyclopentanone, ethyl lactate, PGMEA, or a 1% HCl solution.

After light exposure and developing for photosensitive embodiments, or after application in non-photosensitive embodiments, the structure is ready to undergo etching by acid etching (e.g., aqueous HF, HF vapor, $HF/H_2O$ vapor, HF/alcohol vapor) or PEC etching. During acid etching, the etchant is contacted with the surface of the protective layer remote from the substrate and primer layer (if present). This can be accomplished by spraying or puddling the etchant on this surface.

Advantageously, the inventive protective systems will experience very little or no acid etchant penetration during these etching processes. Thus, when subjected for about 1-2 hours to etching in an approximately 48% by weight aqueous HF solution having a temperature of about 20-25° C., the inventive protective layer will have less than about 0.1 pinholes per $cm^2$ of substrate, and preferably less than about 0.05 pinholes per $cm^2$ of substrate, when observed under a microscope at 10× magnification. Furthermore, when subjected for about 1-2 hours to etching with HF vapor having a temperature of about 40-50° C., a layer immediately below the protective layer (or immediately below the primer layer, if utilized) will experience a thickness loss of less than about 10%, preferably less than about 5%, and even more preferably about 0%.

The same results can be achieved with many acidic etchants, including those selected from the group consisting of HCl, phosphoric acid, $HCl/HNO_3$, buffered oxide etchant ("BOE"), $HF/HNO_3$/acetic acid, concentrated $H_2SO_4$, concentrated $HNO_3$, and mixtures of the foregoing. Prior art layers typically dissolve, blister, and/or peel relatively quickly in these solutions, and thus lack the protective qualities of the present invention.

EXAMPLES

The following examples set for methods in accordance with the invention. It is to be understood, however, that these examples are provided by way of illustration and nothing therein should be taken as a limitation upon the overall scope of the invention.

Example 1

High-Molecular Weight COC Composition

In this procedure, 20 grams of a high-molecular weight COC (TOPAS® 8007s-04 with a molecular weight of 88,000 Daltons, obtained from Topas Advanced Polymers, Florence, Ky.) were dissolved in 80 grams of d-limonene (obtained from Florida Chemical Inc., Winter Haven, Fla.) in a 250-ml amber glass bottle. The resulting solution was filtered through a 0.2-μm Meissner Vangard filter (obtained from Meissner Filtration Products Inc., Camarillo, Calif.). The solution was spin-coated onto four silicon oxide wafers at 1,000 rpm for 60 seconds, followed by prebaking at 110° C. for 2 minutes and then final baking at 175° C. for 2 minutes. The resulting films had thicknesses of approximately 10.6 μm. Testing was performed by dipping the wafers with the as-formed films in concentrated (48%) or dilute (5%) aqueous HF solutions. The results indicated that the films could withstand HF for a couple of hours. The film was also tested in HF vapor/ethanol vapor carried through nitrogen for 1 hour at 45° C. The oxide thickness underneath the films did not change after removing the COC coating, which indicated that the high-molecular-weight COC withstood HF vapor etching in ethanol.

Example 2

High- and Low-Molecular Weight COC Composition

In this example, 15 grams of a high-molecular weight COC (TOPAS® 8007s-04) and 15 grams of a low-molecular-weight COC (TOPAS® Toner with a molecular weight of 8,000 Daltons, obtained from Topas Advanced Polymers, Florence, Ky.) were dissolved in 70 grams of d-limonene in a 250-ml amber glass bottle. The resulting solution was filtered through a 0.2-μm Meissner Vangard filter. The solution was spin-coated onto four silicon wafers at 1,000 rpm for 60 seconds, followed by prebaking at 110° C. for 2 minutes and then final baking at 175° C. for 2 minutes. The resulting films had thicknesses of approximately 14 μm. Testing was performed by dipping the wafers with the as-formed films in concentrated (48%) or dilute (5%) aqueous HF solutions. Results indicated that the films could withstand HF for 2 hours. The film was then tested in HF vapor/ethanol vapor carried through nitrogen for 1 hour at 45° C. The oxide thickness underneath the films did not change after removing the coating, which indicated that the blended COC coating withstood HF vapor etching in ethanol.

Example 3

High-Molecular-Weight COC Composition with a Photosensitive Crosslinking Agent In this procedure, 19.8 grams of a high-molecular weight COC (TOPAS® 8007s-04) were dissolved in 63.5 grams of mesitylene and 15.9 grams of d-limonene in a 250-ml amber glass bottle, after which 0.8 gram of 2,6-bis-(4-azidobenzylidene)-4-methylcyclohexanone was added. The resulting solution was filtered through a 0.2-μm Meissner Vangard filter. The solution was spin-coated onto lour silicon wafers at 3,000 rpm for 60 seconds, followed by prebaking at 110° C. for 2 minute. The resulting films were smooth and defect-free and had thicknesses of approximately 3 μm. The films were then subjected to broadband exposure at doses of 400 mJ/cm$^2$ and higher, followed by a post-exposure bake at 110° C. for 3 minutes, which produced clear latent images. The images were developed by either spraying or puddling d-limonene or mesitylene onto the films for 40 seconds followed by rinsing with IPA for 20 seconds and spin-drying at 2,500 rpm for 30 seconds. A final bake was carried out for 2 minutes at 175° C. No film loss occurred at the exposed portions of the film. Clean and sharp images were achieved with a resolution of 5 nm.

Example 4

High-Molecular Weight COC Composition with Plasticizer/Adhesion Promoter and Photosensitive Crosslinking Agent In this Example, 18.9 grams of a high-molecular weight COC (TOPAS® 8007s-04) and 0.9 gram of polyisobutylene (obtained from Scientific Polymer Products Inc., Ontario, N.Y.) were dissolved in 63.5 grams of mesitylene and 15.9 grams of d-limonene in a 250-ml amber glass bottle, after which 0.8 gram of 2,6-bis-(4-azidobenzylidene)-4-methylcyclohexanone was added. The resulting solution was filtered through a 0.2-μm Meissner Vangard filter. The solution was spin-coated onto four silicon wafers at 3,000 rpm for 60 seconds, followed by prebaking at 110° C. for 2 minutes. The resulting films were smooth and defect-free and had thicknesses of approximately 2.7 μm. The films were subjected to broadband exposure at doses of 400 mJ/cm$^2$ and higher followed by a post-exposure bake at 110° C. for 3 minutes, which produced clear latent images. The images were developed by either spraying or puddling d-limonene or mesitylene onto the films for 40 seconds followed by rinsing with IPA for 20 seconds and spin-drying at 2,500 rpm for 30 seconds. A final bake was carried out at 175° C. for 2 minutes. No film loss occurred at the exposed portions of the film. Clean and sharp images were achieved with a resolution of 5 μm.

Example 5

High-Molecular Weight COC Composition with Plasticizer/Adhesion Promoter and Photosensitive Crosslinking Agent In this procedure, 18.9 grams of a high-molecular weight COC (TOPAS® 8007s-04) and 0.9 grams of polyisobutylene were dissolved in 63.5 grams of mesitylene and 15.9 grains of d-limonene in a 250-ml amber glass bottle, after which 0.8 gram of 2,6-bis-(4-azidobenzylidene)-4-methyleyclohexanone was added. The resulting solution was filtered through a 0.2-μm Meissner Vangard filter. The solution was spin-coated onto four silicon wafers at 3,000 rpm for 60 seconds. The resulting films were smooth and defect-free and had thicknesses of approximately 2.7 μm. The films then underwent i-line exposure at doses of 600 mJ/cm$^2$ and higher followed by a post-exposure bake at 110° C. for 3 minutes, which produced clear latent images. The images were developed by either spraying or puddling d-limonene or mesitylene onto the films for 40 seconds followed by rinsing with IPA for 20 seconds and spin-drying at 2,500 rpm for 30 seconds. A final bake was carried out at 175° C. for 2 minutes. No film loss occurred at the exposed portions of the film. Clean and sharp images were achieved with a resolution of 5 μm.

Example 6

High- and Low-Molecular Weight COC Composition with a Photosensitive Crosslinking Agent In this Example, 12 grams of a high-molecular-weight COC (TOPAS® 8007s-04) and 12 grams of a low-molecular-weight COC (TOPAS® Toner) were dissolved in 60 grams of mesitylene and 15 grams of d-limonene in a 250-ml amber glass bottle. To make the composition photosensitive, 1 gram of 2,6-bis-(4-azidobenzylidene)-4-methylcyclohexanone was then added. The resulting solution was filtered through a 0.2-μm Meissner Vangard filter. The solution was spin-coated onto four silicon wafers at 3,000 rpm for 60 seconds, followed by prebaking at 110° C. for 2 minutes. The resulting films were smooth and defect-tree and had thicknesses of approximately 3.1 μm. The films then underwent broadband exposure at doses of 400 mJ/cm$^2$ and higher, followed by a post-exposure bake at 110° C. for 3 minutes, which produced clear latent images. The images were developed by either spraying or puddling d-limonene or mesitylene onto the films for 40 seconds, followed by rinsing with IPA for 20 seconds and spin-drying at 2,500 rpm for 30 seconds. A final bake was carried out at 175° C. for 2 minutes. No film loss occurred at the exposed portions of the film. Clean and sharp images were achieved with a resolution of 5 μm.

Example 7

High- and Low-Molecular Weight COC Composition with Plasticizer/Adhesion Promoter and Photosensitive Crosslinking Agent In this procedure, 11.4 grams of a high-molecular-weight COC (TOPAS® 8007s-04) and 11.4 grams of a low-molecular-weight COC (TOPAS® Toner) were dissolved in 60 grams of mesitylene and 15 grams of d-limonene along with 1.2 grams of polyisobutylene in a 250-ml amber glass bottle. To make the composition photosensitive, 1 gram of 2,6-bis-(4-azidobenzylidene)-4-methylcyclohexanone was added. The resulting solution was filtered through a 0.2-μm Meissner Vangard filter. The solution was spin-coated onto four silicon wafers at 3,000 rpm for 60 seconds, followed by prebaking at 110° C. for 2 minutes. The resulting films were smooth and defect-free and had thicknesses of approximately 3.1 μm. The films were subjected to broadband exposure at doses of 600 mJ/cm$^2$ and higher, followed by a post-exposure bake at 110° C. for 3 minutes, which produced clear latent images. The images were developed by either spraying or puddling d-limonene or mesitylene onto the films for 40 seconds followed by rinsing with IPA for 20 seconds and spin-drying at 2,500 rpm for 30 seconds. A final bake was carried out at 175° C. for 2 minutes. No film loss occurred at the exposed portions of the film. Clean and sharp images were achieved with a resolution of 5 μm.

Example 8

High-Molecular Weight COC Composition with Plasticizer/Adhesion Promoter and Photosensitive Crosslinking Agent In this procedure, 45.6 grams of a high-molecular-weight COC (TOPAS® 8007s-04) were dissolved in 121.6 grams of mesitylene and 30.4 grams of d-limonene along with 2.4 grams of polyisobutylene, all in a 250-ml amber glass bottle. In order to make the composition photosensitive, 1.92 grams of 2,6-bis-(4-azidobenzylidene)-4-methylcyclohexanone were then added. The resulting solution was filtered through a 0.2-μm Meissner Vangard filter. This solution was filtered through a 0.2-μm Meissner Vangard filter, after which it was spin-coated onto silicon wafers at 1,200 rpm to form smooth and defect-free films having thicknesses of approximately 13 μm. The films were subjected to broadband exposure at doses of 2,000 mJ/cm$^2$ and higher, followed by a post exposure bake at 145° C. for 5 minutes, which produced clear latent images. The images were then developed by either spraying or puddling using d-limonene/dodecence (9/1; v/v) with about 5% film loss in the thickness of the exposed portions. A final hake was carried out at 175° C. for 5 minutes. Clean and sharp images were achieved with a resolution of 20 μm.

Example 9

Bilayer System with High-Molecular Weight COC Layer and Poly(4-Vinyl Pyridine) Layer In this Example, 14 grams of basic polymer poly(4-vinyl pyridine) (Poly4-VP, obtained from Sigma Aldrich Inc, St. Louis, Mo.) were dissolved in 186 grams of cyclopentanone (obtained from Alfa Aesar Inc, Ward Hill, Mass.) in a 250-ml amber glass bottle. Next, 139.65 grams of a high-molecular-weight COC (TOPAS® 8007s-04) and 40.35 grams of a low-molecular-weight COC (TOPAS® Toner) were dissolved in 420 grams of d-limonene in a 1-liter amber glass bottle. Both solutions were separately filtered through a 0.2-μm Meissner Vangard filter. The solution of Poly(4-VP) was spin-coated onto four blanket thermal oxide wafers at 1,200 rpm followed by baking at 110° C. for 2 minutes to produce thin films having a thickness of approximately 400 nm. Next, the solution of COC blends was spin-coated onto the Poly(4-VP) thin films at 2,100 rpm followed by baking at 110° C. for 3 minutes and 175° C. for 3 minutes to produce thin films having a thickness of approximately 15 μm.

Testing was performed by dipping the wafers with the as-formed films in concentrated (48%) or dilute (5%) aqueous HF solutions. Results indicated that the films could withstand HF for a couple of hours without blisters being formed during etching. The films were also tested in HF vapor/ethanol vapor carried through nitrogen for 1 hour at 45° C. in either mild (i.e., a thermal oxide etch rate of 100 Å/min) or medium (i.e., a thermal oxide etch rate of 350 Å/min) conditions. No film degradation, blistering, or dislocation, and no edge attacking were observed after HF vapor etching. Moreover, the oxide thickness beneath the films did not change after removing the COC and Poly(4-VP) coatings, which demonstrated the effectiveness of this bilayer structure at resisting the HF vapor etching.

Example 10

Bilayer System with High- and Low-Molecular Weight COC Layer and Poly(4-Vinyl Pyridine) Layer In this Example, 14 grams of basic polymer poly(4-vinyl pyridine) (Poly4-VP) were dissolved in 186 grams of cyclopentanone in a 250-ml amber glass bottle. Next, 139.65 grams of a high-molecular-weight COC (TOPAS® 8007s-04) and 40.35 grams of a low-molecular-weight COC (TOPAS® Toner) were dissolved in 420 grams of d-limonene in a 1-liter amber glass bottle. Both solutions were separately filtered through a 0.2-μm Meissner Vangard filter. The solution of Poly(4-VP) was spin-coated onto four patterned, thermal oxide silicon wafers (625 μm×625 μm square) at 1,200 rpm, followed by baking at 110° C. for 2 minutes to produce thin films having thicknesses of approximately 400 nm. Next, the solution of COC blends was spin-coated onto the Poly(4-VP) thin films at 2,100 rpm followed by baking at 110° C. for 3 minutes and 175° C. for 3 minutes to produce thin films having thicknesses of approximately 15 μm.

Testing was performed by dipping the wafers with the as-formed films in concentrated (48%) or dilute (5%) aqueous HF solutions. Results indicated that the films could withstand HF for a couple of hours without blisters forming during etching. The films were tested in HF vapor/ethanol vapor carried through nitrogen for 1 hour at 45° C. at either mild (i.e., a thermal oxide etch rate of 100 Å/min) or medium (i.e., a thermal oxide etch rate of 350 Å/min) conditions. No film degradation, blistering, or dislocation was observed. Furthermore, no edge attacking or square oxide attacking was observed over the oxide square surface after HF vapor etching. Finally, the oxide thickness of the oxide square patterns did not change after removing the COC and Poly(4-VP) coatings, which demonstrated the effectiveness of this bilayer structure at resisting the HF vapor etching.

Example 11

Bilayer System with High- and Low-Molecular Weight COC Layer and Poly(4-Vinyl Pyridine) Layer In this procedure, 14 grams of basic polymer poly(4-vinyl pyridine) (Poly4-VP) were dissolved in 186 grams of cyclopentanone in a 250-ml amber glass bottle. Next, 139.65 grams of a high-molecular-weight COC (TOPAS® 8007s-04) and 40.35 grams of a low-molecular-weight COC (TOPAS® Toner) were dissolved in 420 grams of d-limonene in a 1-liter amber glass bottle. Both solutions were separately filtered through a 0.2-μm Meissner Vangard filter. The solution of Poly(4-VP) was spin-coated onto lour blanket thermal oxide silicon wafers at 1,200 rpm, followed by baking at 110° C. for 2 minutes to produce thin films having thicknesses of approximately 400 nm. The solution of COC blends was then spin-coated onto the Poly(4-VP) thin films at 3,900 rpm followed by baking at 110° C. for 3 minutes and 175° C. for 3 minutes to produce thin films having a thickness of approximately 10 μm.

Testing was performed by dipping the wafers with the as-formed films in concentrated (48%) or dilute (5%) aqueous HF solutions. The results indicated that the films could withstand HF for a couple of hours without blisters forming during etching. The films were then tested in HF vapor/ethanol vapor carried through nitrogen for 1 hour at 45° C. at either mild (i.e., a thermal oxide etch rate of 100 Å/min) or medium (i.e., a thermal oxide etch rate of 350 Å/min) conditions. No film degradation or dislocation, and no edge attacking were observed after HF vapor etching. Moreover, the oxide thickness below the films did not change after removing the COC and Poly(4-VP) coatings, which demonstrated the effectiveness of this bilayer structure at resisting the HF vapor etching.

Example 12

Bilayer System with High- and Low-Molecular Weight COC Layer and Poly(4-Vinyl Pyridine) Layer In this Example, 14 grams of basic polymer poly(4-vinyl pyridin) were dissolved in 186 grams of cyclopentanone in a 250-ml amber glass bottle. Next, 139.65 grams of a high-molecular-weight COC (TOPAS® 8007s-04) and 40.35 grams of a low-molecular-weight COC (TOPAS® Toner) were dissolved in 420 grams of d-limonene in a 1-liter amber glass bottle. Both solutions were separately filtered through a 0.2-μm Meissner Vangard filter. The solution of Poly(4-VP) was spin-coated onto four patterned thermal oxide silicon wafers (625 μm×625 μm square) at 1,200 rpm, followed with baking at 110° C. for 2 minutes to produce thin films having thicknesses of approximately 400 nm. The solution of COC blends was spin-coated onto the Poly(4-VP) thin films at 2,100 rpm, followed with baking at 110° C. for 3 minutes and 175° C. for 3 minutes to produce thin films having thicknesses of approximately 10 μm.

Testing was performed by dipping the wafers with the as-formed films in concentrated (48%) or dilute (5%) aqueous HF solutions. The results indicated that the films could withstand HF for a couple of hours without blisters forming during etching. The films were then tested in HF vapor/ethanol vapor carried through nitrogen for 1 hour at 45° C. at both mild (i.e., a thermal oxide etch rate of 100 Å/min) and medium (i.e. a thermal oxide etch rate of 350 Å/min) conditions. No film degradation, blistering, or dislocation was observed. Additionally, no edge attacking or square oxide attacking was observed over the oxide square surface after HF vapor etching. Finally, the oxide thickness of the oxide square patterns did not change after removing the COC and Poly(4-VP) coatings, which demonstrated the effectiveness of this bilayer structure at resisting the HF vapor etching.

Example 13

Bilayer System with High- and Low-Molecular Weight COC Layer and Poly(2-Vinyl Pyridine-Co-Styrene) Layer In this procedure, 6 grams of a basic polymer poly(2-vinyl pyridine-co-styrene) (Poly(2-VP-co-St), obtained from Sigma Aldrich Inc, St. Louis, Mo.) were dissolved in 194 grams of cyclopentanone in a 250-ml amber glass bottle. Next, 139.65 grams of a high-molecular-weight COC (TOPAS® 8007s-04) and 40.35 grams of a low-molecular-weight COC (TOPAS® Toner) were dissolved in 420 grams of d-limonene in a 1-liter amber glass bottle. Both solutions were filtered through a 0.2-μm Meissner Vangard filter. The solution of Poly(2-VP-co-St) was spin-coated onto four thermal oxide silicon wafers at 1,000 rpm to produce thin films having thicknesses of approximately 210 nm, followed by baking at 110° C. for 2 minutes. The solution of COC blends was spin-coated onto the Poly(2-VP-co-St) thin films at 1,500 rpm to produce thin films having thicknesses of approximately 20 μm, followed by baking at 110° C. for 3 minutes and 175° C. for 3 minutes.

Testing was performed by dipping the wafers with the as-formed films in concentrated (48%) or dilute (5%) aqueous HF solutions. The results indicated that the films could withstand HP for a couple of hours without blisters being formed during etching. The films were then tested in HF vapor/ethanol vapor carried through nitrogen for 1 hour at 45° C. under mild conditions (i.e., a thermal oxide etch rate of 100 Å/min). The films were blistered, dislocated and damaged after HF vapor etching. This demonstrated the difference in etching behavior when using Poly(2-VP-co-St) instead of Poly(4-VP).

Example 14

Bilayer System with Photosensitive High-Molecular Weight COC Layer and Poly(4-Vinyl Pyridine) Layer

In this Example, 14 grams of basic polymer poly(4-vinyl pyridine) (Poly-4-VP) were dissolved in 186 grams of cyclopentanone in a 250-ml amber glass bottle. In a different 250-ml amber glass bottle, 45.6 grams of a high-molecular-weight COC (TOPAS® 8007s-04) were dissolved in 121.6 grams of mesitylene and 30.4 grams of d-limonene along with 2.4 grams of polyisobutylene. In order to make the composition photosensitive, 1.92 grams of 2,6-bis-(4-azidobenzylidene)-4-methylcyclohexanone were then added. Both solutions were separately filtered through a 0.2-µm Meissner Vangard filter. The solution of Poly(4-VP) was spin-coated onto silicon wafers at 1,200 rpm, followed by baking at 110° C. for 2 minutes to produce thin films having thicknesses of approximately 400 nm. The solution of photosensitive COC was then spin-coated onto the Poly(4-VP) thin films at 1,200 rpm, followed by baking at 110° C. for 5 minutes to produce thin films having thicknesses of approximately 13 µm.

The films were then subjected to broadband exposure at doses of 2,000 mJ/cm$^2$ and higher, followed by a post exposure bake at 145° C. for 5 minutes, which produced clear latent images. The photosensitive COC coating was developed by either spraying or puddling with d-limonene/dodecence (9/1; v/v), resulting in about a 5% film loss at the exposed portions of the film. A final bake was carried out at 175° C. for 3 minutes. The Poly(4-VP) layer can be developed by either an organic solvent (e.g. IPA, cyclopentanone, PGMEA, ethyl lactate, mixtures of the foregoing) or 1% HCl solution to yield clean and sharp images with a resolution of 20 µm.

Example 15

Bilayer System with Photosensitive High-Molecular Weight COC Layer and Poly(4-Vinyl Pyridine) Layer

In this Example, 14 grams of basic polymer poly(4-vinyl pyridine) (Poly-4-VP) were dissolved in 186 grams of cyclopentanone in a 250-ml amber glass bottle. In a different 250 ml amber glass bottle, 45.6 grams of a high-molecular-weight COC (TOPAS® 8007s-04) were dissolved in 121.6 grams of mesitylene and 30.4 grams of d-limonene along with 2.4 grams of polyisobutylene. In order to make the composition photosensitive, 1.92 grams of 2,6-bis-(4-azidobenzylidene)-4-methylcyclohexanone were then added. Both solutions were filtered through a 0.2-µm Meissner Vangard filter. The solution of Poly(4-VP) was spin-coated onto four patterned thermal oxide silicon wafers (625 µm×625 µm square) at 1,000 rpm, followed by baking at 110° C. for 2 minutes to produce thin films having thicknesses of approximately 600 nm. The solution of photosensitive COC was then spin-coated onto the Poly(4-VP) thin films at 1,250 rpm, followed by baking at 110° C. for 5 minutes to produce thin films having thicknesses of approximately 12.5 µm. The films were then subjected to broadband flood exposure at doses of 2,000 mJ/cm$^2$ and higher, followed by a post exposure bake at 145° C. for 5 minutes and a final bake at 175° C. for 3 minutes.

Testing was performed by dipping the wafers with the as-formed films in concentrated (48%) or dilute (5%) aqueous HF solutions. The results indicated that the films could withstand HF for a couple of hours without blisters forming during etching. The films were then tested in HF vapor/ethanol vapor carried through nitrogen for 1 hour at 45° C. under mild (i.e., a thermal oxide etch rate of 100 Å/min) or medium (i.e., a thermal oxide etch rate of 350 Å/min) conditions. No film degradation, blistering, or dislocation, and no edge attacking were observed after HF vapor etching. Moreover, the oxide thickness underneath the films did not change after removing the photo-crosslinked COC and Poly(4-VP) coatings by Nanostrip®, which demonstrated the effectiveness of this bilayer structure at resisting the HF vapor etching.

We claim:

1. A method of forming a microelectronic structure, said method comprising:
   providing a substrate having a surface;
   optionally forming a primer layer on said substrate surface;
   forming a protective layer on said primer layer, if present, or on said substrate surface if no primer layer is present, to yield a protected stack, said protective layer being formed from a composition comprising a cycloolefin copolymer of recurring cycloolefin monomers and monomers of

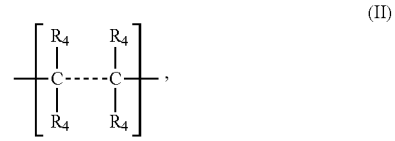

(II)

where:
   - - - - - is a single bond; and
   each $R_4$ is individually selected from the group consisting of —H and alkyl groups;
   said cycloolefin copolymer being dissolved or dispersed in a solvent system, wherein said protective layer would experience very little or no acid etchant penetration if etched by an approximately 48% by weight aqueous HF solution, having a temperature of about 20-25° C., for about 1-2 hours; and
   subjecting said protected stack to an acidic etching process.

2. The method of claim 1, further comprising subjecting said protected stack to further processing steps prior to subjecting said stack to said acidic etching process.

3. The method of claim 1, further comprising exposing said protective layer to broadband UV radiation.

4. The method of claim 3, wherein said protective layer is photosensitive and said exposing yields exposed portions of said protective layer, said exposed portions comprising a crosslinked cycloolefin copolymer.

5. The method of claim 1, wherein said acidic etching process comprises etching with an etchant selected from the group consisting of aqueous HF, HF vapor, HF/H$_2$O vapor, HF/alcohol vapor, HCl, phosphoric acid, HCl/HNO$_3$, buffered oxide etchant ("BOE"), HF/HNO$_3$/acetic acid, concentrated H$_2$SO$_4$, concentrated HNO$_3$, and mixtures of the foregoing.

6. The method of claim 1, wherein said cycloolefin copolymer is formed from the polymerization of a cyclic olefin selected from the group consisting of

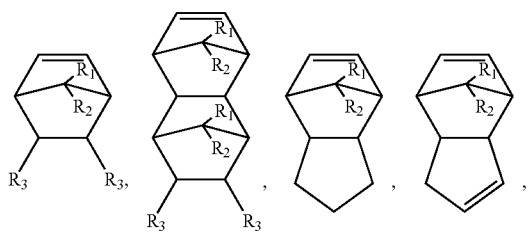

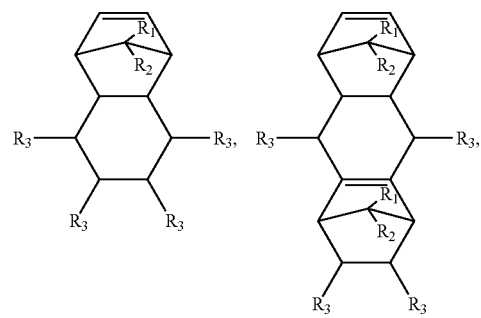

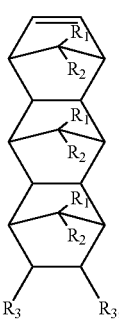

and combinations of the foregoing,
where:
each $R_1$ and $R_2$ is individually selected from the group consisting of —H, and alkyl groups; and
each $R_3$ is individually selected from the group consisting of —H, substituted and unsubstituted aryl groups, alkyl groups, cycloalkyl groups, aralkyl groups, ester groups, ether groups, acetyl groups, alcohols, aldehyde groups, ketones, nitriles, and combinations thereof.

7. The method of claim 1, wherein said cycloolefin recurring monomers are selected from the group consisting of:

(I)

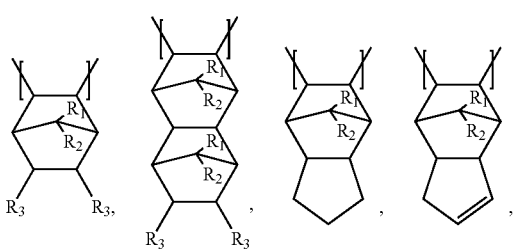

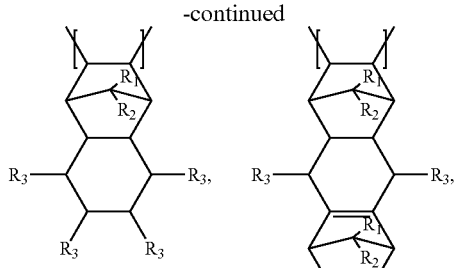

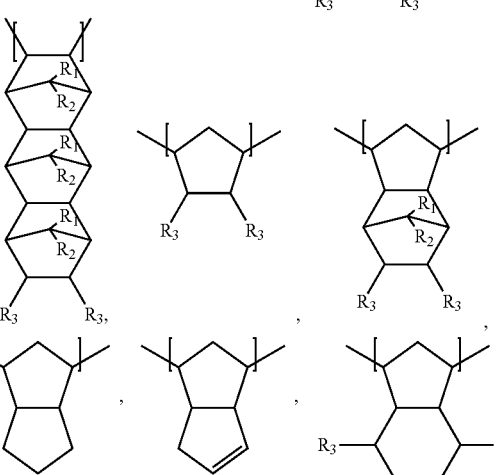

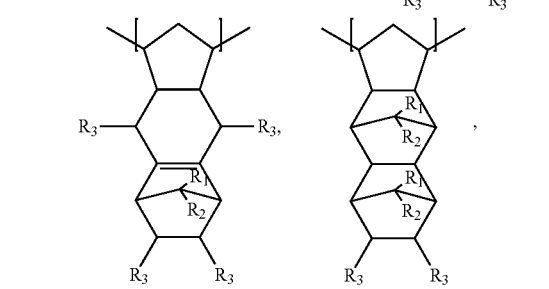

and combinations of the foregoing,
where:
each $R_1$ and $R_2$ is individually selected from the group consisting of —H, and alkyl groups; and
each $R_3$ is individually selected from the group consisting of —H, substituted and unsubstituted aryl groups, alkyl groups, cycloalkyl groups, aralkyl groups, ester groups, ether groups, acetyl groups, alcohols, aldehyde groups, ketones, nitriles, and combinations thereof.

8. The method of claim 1, wherein a primer layer is formed on said substrate surface.

9. The method of claim 8, wherein said primer layer is formed from composition comprising a basic polymer in a solvent system.

10. The method of claim 9, wherein said basic polymer is selected from the group consisting of polyvinyl pyridine, polymelamines, polyethylenimine, triazine-containing copolymers, styrene maleimide resin, poly(4-vinyl pyridine-co-styrene), and poly(2-vinyl pyridine-co-styrene).

11. The method of claim 1, wherein said substrate is selected from the group consisting of thermal oxide substrates, Si substrates, SiO₂ substrates, Si₃N₄ substrates, SiO₂ on silicon substrates, Si₃N₄ on silicon substrates, glass substrates, quartz substrates, ceramic substrates, semiconductor substrates, and metal substrates.

12. The method of claim 1, wherein said protective layer exhibits less than about 0.1 pinholes per cm³ of said substrate when subjected to said acidic etching process.

13. The method of claim 1, wherein said cycloolefin copolymer has a glass transition temperature ($T_g$) of from about 60° C. to about 200° C.

14. A method of forming a microelectronic structure, said method comprising:

provided a substrate having a surface;

optionally forming a primer layer on said substrate surface;

forming a protective layer on said primer layer, if present, or on said substrate surface if no primer layer is present, to yield a protected stack, said protective layer being formed from a composition comprising a cycloolefin copolymer of recurring cycloolefin monomers and monomers of

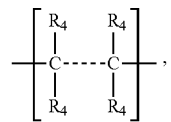

where:
- - - - - is a single bond; and
each $R_4$ is individually selected from the group consisting of —H and alkyl groups;
wherein said cycloolefin copolymer and a photosensitive crosslinking agent are dissolved or dispersed in a solvent system; and subjecting said protected stack to an acidic etching process.

15. The method of claim 14, wherein said crosslinking agent is an azide-based photosensitive crosslinking agent.

16. The method of claim 14, wherein said cycloolefin copolymer has a glass transition temperature ($T_g$) of from about 60° C. to about 200° C.

* * * * *